(12) United States Patent
Liu et al.

(10) Patent No.: US 9,736,932 B1
(45) Date of Patent: Aug. 15, 2017

(54) MAGNET WIRE FOR 3D ELECTRONIC CIRCUITRY

(71) Applicant: Flextronics AP, LLC, Broomfield, CO (US)

(72) Inventors: Weifeng Liu, Dublin, CA (US); Anwar Mohammed, San Jose, CA (US); Murad Kurwa, San Jose, CA (US)

(73) Assignee: Flextronics AP, LLC., Broomfield, CO (US)

(*) Notice: Subject to any disclaimer, the term of this patent is extended or adjusted under 35 U.S.C. 154(b) by 120 days.

(21) Appl. No.: 14/601,072

(22) Filed: Jan. 20, 2015

(51) Int. Cl.
| | |
|---|---|
| *H01K 3/10* | (2006.01) |
| *H05K 1/02* | (2006.01) |
| *H05K 1/18* | (2006.01) |
| *H05K 1/09* | (2006.01) |
| *H05K 3/32* | (2006.01) |

(52) U.S. Cl.
CPC ............. *H05K 1/0284* (2013.01); *H05K 1/09* (2013.01); *H05K 1/18* (2013.01); *H05K 3/32* (2013.01); *Y10T 29/49162* (2015.01)

(58) Field of Classification Search
CPC ........ H05K 1/0218; H05K 1/09; H05K 1/103; H05K 1/18; H05K 3/32; Y10T 29/4162; Y10T 29/49149
USPC .......... 29/825, 832, 840, 850, 827; 174/68.5, 174/259, 260
See application file for complete search history.

(56) References Cited

U.S. PATENT DOCUMENTS

| | | | | | |
|---|---|---|---|---|---|
| 4,711,026 | A | * | 12/1987 | Swiggett | H05K 3/103 29/850 |
| 5,584,121 | A | * | 12/1996 | Arike | C08G 59/027 29/850 |
| 6,233,818 | B1 | * | 5/2001 | Finn | G06K 19/077 29/827 |
| 9,089,057 | B2 | * | 7/2015 | Masuda | H05K 1/0218 |

\* cited by examiner

*Primary Examiner* — Donghai D Nguyen
(74) *Attorney, Agent, or Firm* — Haverstock & Owens LLP

(57) ABSTRACT

A method of and device for making a three dimensional electronic circuit. The method comprises coupling one or more magnet wires with a substrate along a surface contour of the substrate, immobilizing the one or more magnet wires on the substrate, and forming the electronic circuit by electrically coupling the one or more magnet wires with an integrated circuit chip.

14 Claims, 6 Drawing Sheets

MAGNET WIRE FOR 3D ELECTRONIC CIRCUITRY

FIELD OF THE INVENTION

The present invention relates to the field of electronic circuitry. More specifically, the present invention relates to electronic circuitry using magnet wires.

BACKGROUND OF THE INVENTION

Typical circuit traces made by PCB fabrication (printed circuit board) involve using complicated manufacturing process, such as processes of lithography and etching. Another typical circuitry manufacturing process involves using printed conductive inks. The drawbacks of using the printed conductive inks are that the material has high electrical resistance. It is still remaining a great challenge using the typical technologies to fabricate metal traces on a 3D object. Further, the typical mold interconnect device (MID) technology is too complicated and expensive to viably make 3D circuitry.

SUMMARY OF THE INVENTION

Methods of and devices for making 3D (three dimensional) electronic circuitry using magnet wires are disclosed. Magnetic wires are the thin insulated wires conventionally used as the windings in coils and transformers. The magnet wires can be used to replace metal traces that are fabricated using traditional PCB etching process and can be used to replace the conductive ink. In some embodiments, the magnet wires comprises micro-solid magnet wires coated with a layer of insulating material, such as a polymer (e.g., polyvinyl formal (formvar: thermoplastic resins that are polyvinyl formals, which are polymers formed from polyvinyl alcohol and formaldehyde as copolymers with polyvinyl acetate), polyurethane, polyamide, polyester, polyester-polyimide, polyamide-polyimide, amide-imide resin, polyimide, and teflon). The insulation layer can serve as a flux when it is burnt/burned during soldering.

In some embodiments, the micro-solid magnet wires have a size in the range of 1-50 mils (thousandth of an inch). In some embodiments, the micro-solid magnet wires comprise fine line circuitry that can be applied on a 3D object. In some embodiments, the magnet wires are rounded in its cross sectional view. In other embodiments, the magnet wires are rectangular. In some other embodiments, the magnet wires are circular or square. In some embodiments, the size of the magnet wires is ranging from several mils (e.g., 5 mils) to less than 1 mil.

The pitch between the magnet wires, which is applied on an object, can range from several mils (such as 3 mils) to less than 1 mil. For example, a magnet wire that is applied on an object have 2 mils in its diameter and 2 mils in space to the next nearest magnet wire. A person of ordinary skill in the art appreciates that any other diameters and pitch spaces are applicable.

The wires can be bonded to an integrated circuit chip (hereinafter "chip") or package pads through micro welding using a laser, a thermosonic bonding process, or a soldering process. The insulation coating on the wire tips can be stripped through applying UV or laser, such that the metal traces can be exposed. Metals used to make the core of the wires include copper, copper alloys, aluminum, silver, or a combination thereof. A person of ordinary skill in the art appreciates that other metals can be used.

In an aspect, a method of forming an electronic circuit comprises coupling one or more magnet wires with a substrate along a surface contour of the substrate, immobilizing the one or more magnet wires on the substrate, and forming the electronic circuit by electrically coupling the one or more magnet wires with an electronic component such as an integrated circuit chip. In some embodiments, the contour comprises a non-flat surface. In other embodiments, the method further comprises applying an amount of adhesive on the substrate. In some other embodiments, the method further comprises applying an amount of adhesive on the one or more magnet wires. In some embodiments, the one or more magnet wires comprise a self bonding magnet wire. In some other embodiments, the method further comprises applying an amount of alcohol. In some embodiments, the method further comprises bonding in an oven. In some other embodiments, the method further comprises bonding by generating an electric current. In some embodiments, the method comprises removing a portion of an insulating layer by using a laser pulse. In some other embodiments, the method further comprises covering the portion with an insulating material.

In another aspect, an electronic circuit comprises one or more magnet wires couples with an integrated circuit chip on a surface of a substrate. In some embodiments, the surface comprises a non-flat surface. In other embodiments, the surface is a three dimensional surface. In some other embodiments, the one or more magnet wires comprise an aluminium wire. In some embodiments, the one or more magnet wires comprise a silver wire. In some other embodiments, the one or more magnet wires comprise a copper wire.

In another aspect, a method of forming a three dimensional electronic circuit comprises shaping a magnet wire according to a surface shape of a substrate, immobilizing the magnet wire on the surface, and coupling the magnet wire with an electronic component.

In some embodiments, the three dimensional electronic circuit is part of a circuit board. In other embodiments, the circuit board is coupled with a microwave oven. In some other embodiments, the circuit board is coupled with an electric motor.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1A:
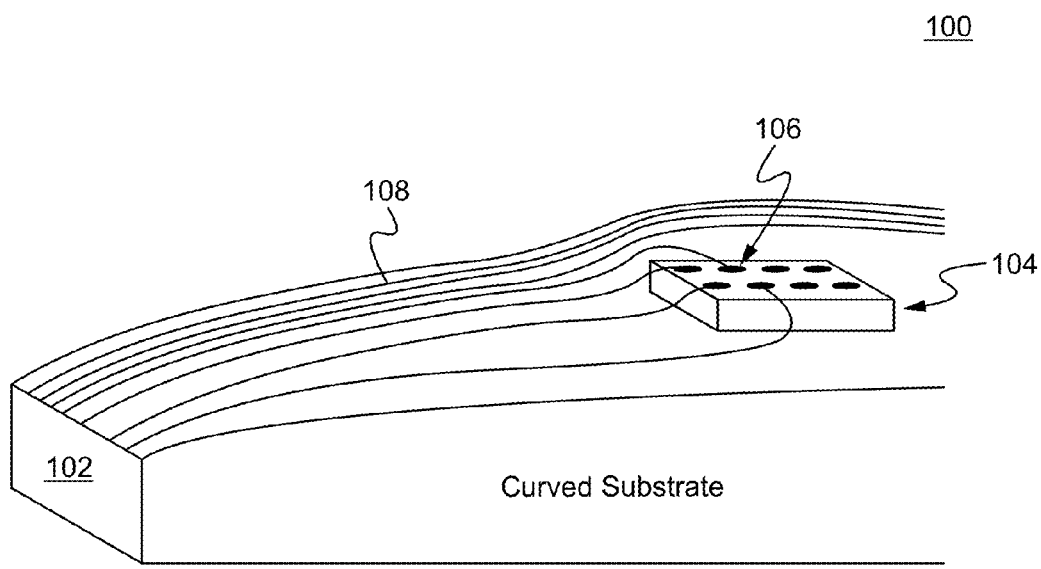
FIGS. 1A and 1B illustrate an electronic circuitry manufacturing method in accordance with some embodiments of the present invention.
Figure 1B:
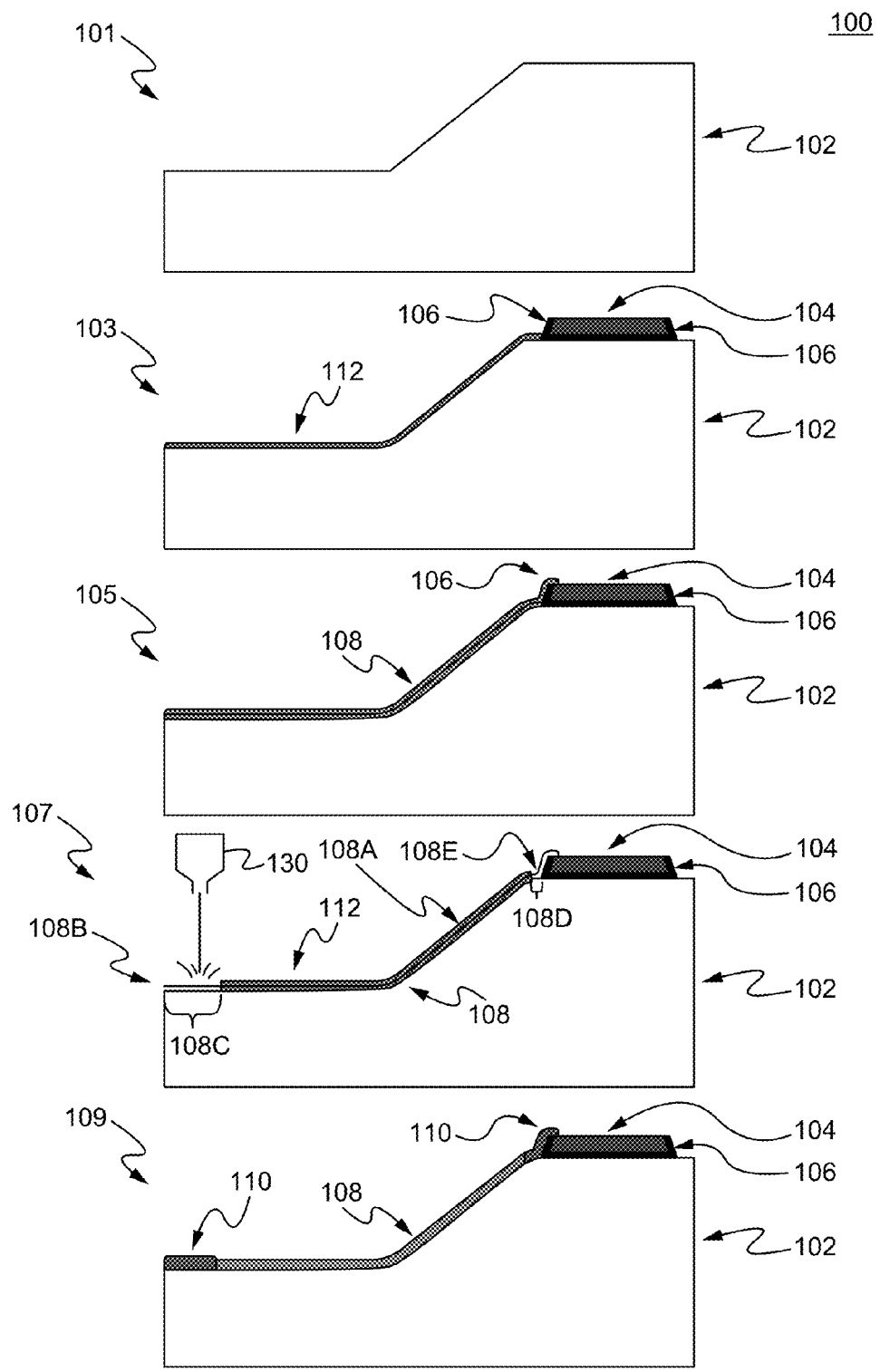

FIGS. 1A and 1B illustrate an electronic circuitry manufacturing method 100 in accordance with some embodiments of the present invention. At Step 101, a substrate 102 is prepared. The substrate 102 can be a polymeric three dimensional object. A person of ordinary skill in the art appreciates that the substrate 102 can be any substrates or supporting base.

At Step 103, a computer chip 104 is coupled with the substrate 102. The coupling of the computer chip 104 and the substrate 102 can be achieved by using a die attaching material 106, such as a conducting/non-conducting glue. The coupling immobilizes or secures the computer chip 104 on the substrate 102. Further, an amount of adhesives 112 is applied on the surface of the substrate, such that magnet wires are able to be coupled with/secured on the surface of the substrate 102.

At Step 105, one or more magnet wires 108 are coupled with the substrate 102. Heat, a laser beam, UV light, or a combination thereof is applied on the surface of the substrate 102 and wires 108, such that the wires 108 are secured on the surface of the substrate 102.

At Step 107, predetermined portions 108C and 108D of an insulation layer 108A of the wires 108 are removed using a laser pulse 130 or any cutting tools, such as any mechanical cutting devices (e.g., scissors, strippers, nips, knifes among others). The predetermined portions 108C and 108D of insulation layer 108A is stripped and the portions 108B and 108E of a conducting wire are exposed, which are welded to a pad of the computer chip 104. A person of ordinary skill in the art appreciates that the predetermined portions 108C and 108D can be any length (e.g., 0.2-0.5 cm or the tip of the magnet wires), so long as it is sufficient to be welded/connected with targeting connecting components (such as the pad of the computer chips).

At Step 109, a protective layer 110 is applied to cover/encapsulate the welding/exposed conducting wire portion. The protective layer 110 can be a polymer, such as PE, PP or polyurethane. The protective layer 110 can also be an insulating material, such as an insulating self-adhesive tape.

Figure 2:
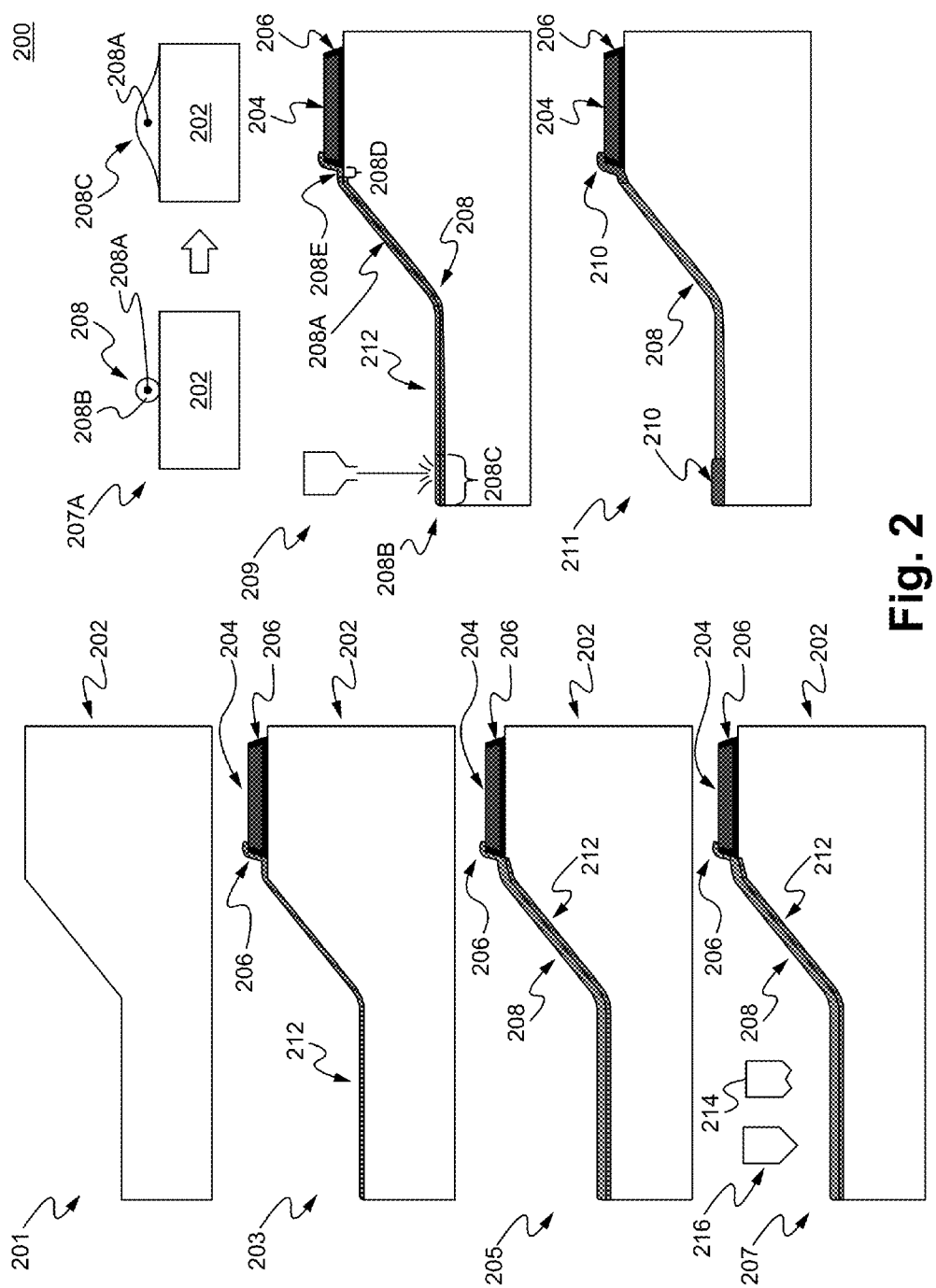
FIG. 2 illustrates another electronic circuitry manufacturing method in accordance with some embodiments of the present invention.

FIG. 2 illustrates another electronic circuitry manufacturing method 200 in accordance with some embodiments of the present invention. At Step 201, a substrate 202 is manufactured. The substrate 202 can be a polymeric three dimensional object.

At Step 203, a computer chip 204 is coupled with the substrate 202. The coupling of the computer chip 204 and the subtract 202 can be achieved by using a die attaching material 206, such as a conducting/non-conducting glue. The coupling immobilizes or secures the computer chip 204 on the substrate 202. Further, an amount of adhesives 212 is applied on the surface of the substrate, such that magnet wires are able to be coupled with/secured on the surface of the substrate 202. A person of ordinary skill in the art appreciates that the amount of adhesive 212 can be sufficient to secure the attaching object from falling off. At Step 205, one or more magnet wires 208 are coupled with the substrate 202 via the attaching force of the adhesive 212.

At Step 207, an external force/pressure is applied on the wires 208, such that the wires 208 are firmly coupled with the substrate 202. The force/pressure can be generated by a mechanical device 214, such as a pressing roller. Next, a laser 216 is used to melt a polymer skin/insulation coating that wraps a conductive wire of the wires 208. The polymer skin/insulation coating solidifies when it cools down below its melting point. The melting and solidification processes form a new protecting layer over the wires 208 on the substrate 202. As shown in a cross sectional view 207A, the insulating coating 208B of the wires 208 melts and forms a new protecting layer 208C over the conducting wire 208A of the wires 208.

At Step 209, predetermined portions 208C and 208D of an insulation layer 208A of the wires 208 are cut using a laser device 230 or any cutting tools, such as any mechanical cutting devices (e.g., scissors, strippers, nips, knifes among others). The predetermined portions 208C and 208D of insulation layer 208A are stripped and the portions 208B and 208E of a conducting wire are exposed, which are welded to a pad of the computer chip 204. A person of ordinary skill in the art appreciates that the predetermined portions 208C and 208D can be any length (e.g., 0.2-0.5 cm or the tip of the magnet wires), so long as it is sufficient to be welded/connected with targeting connecting components (such as the pad of the computer chips).

At Step 211, a protective layer 210 is applied to cover/encapsulate the welding/exposed conducting wire portion. The protective layer 210 can be a polymer, such as PE, PP or polyurethane. The protective layer 210 can also be an insulating material, such as an insulating self-adhesive tape.

Figure 3:
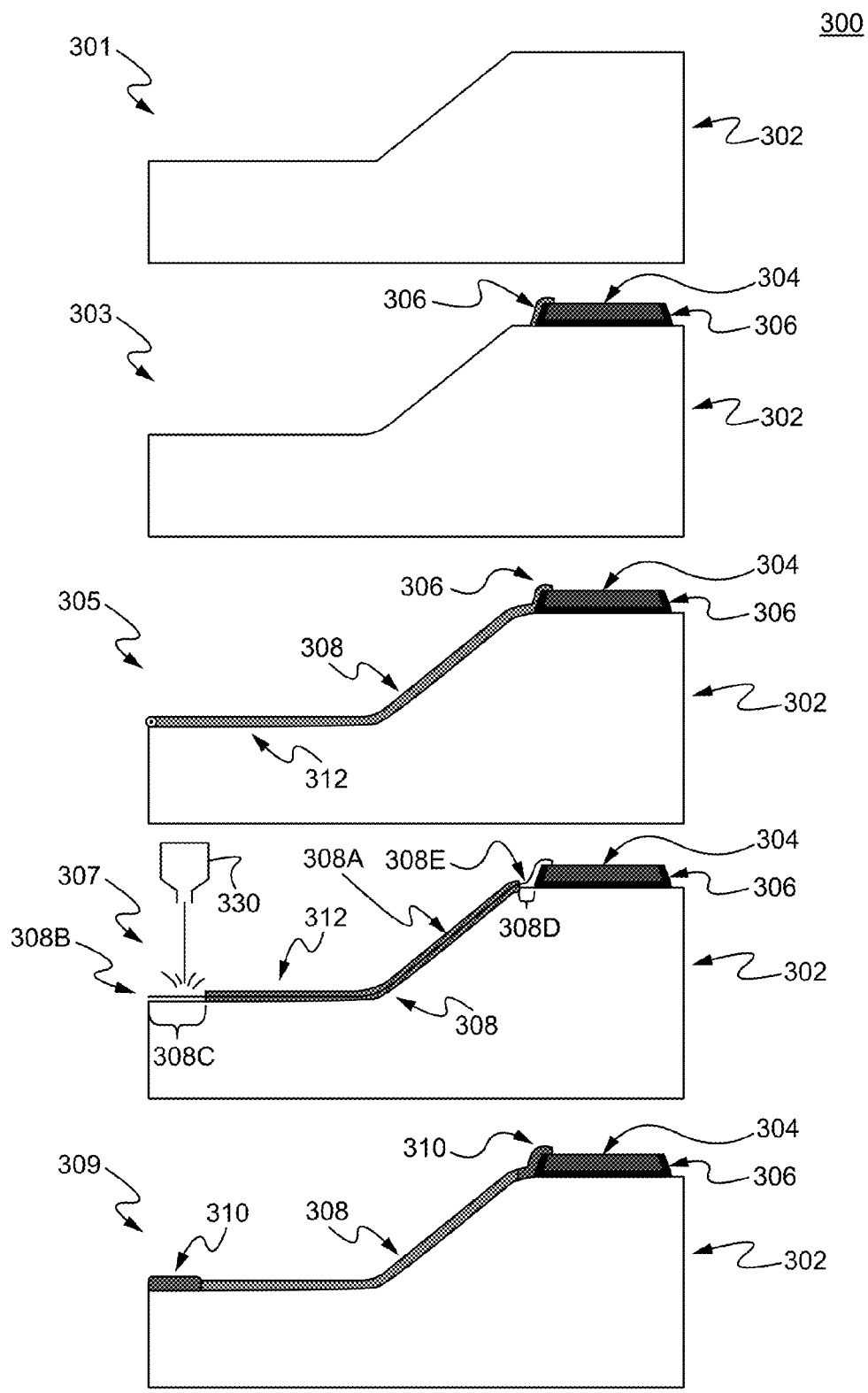
FIG. 3 illustrates another electronic circuitry manufacturing method in accordance with some embodiments of the present invention.

FIG. 3 illustrates another electronic circuitry manufacturing method 300 in accordance with some embodiments of the present invention. At Step 301, a substrate 302 is manufactured. The substrate 302 can be a polymeric three dimensional object.

At Step 303, a computer chip 304 is coupled with the substrate 302. The coupling of the computer chip 304 and the substrate 302 can be achieved by using a die attaching material 306, such as a conducting/non-conducting glue. The coupling immobilizes or secures the computer chip 304 on the substrate 302.

At Step 305, one or more self bonding magnet wires 308 are coupled with the substrate 302 via the attaching force of the adhesive/enamel 312 on the self bonding magnet wires 308. The enamel 312 can couple the self bonding magnet wires 308 with the substrate 302 using an activating liquid (such as an organic solvent; e.g., alcohol/ethanol/propanol) or a predetermined temperature. Three exemplary self-bonding enamel wire fusing methods are provided, including an alcohol bonding method, an oven bonding method, and a resistance heating method.

In the alcohol bonding method, an amount of alcohol is applied onto wires immediately before or sometime before coil winding or the wires are soaked into alcohol after the winding process. After the application of the alcohol, heating is performed to enhance an adhesive strength. The alcohol bonding method can be used in making electrical equipment, such as brushless motors.

In the oven bonding method, heat-sealing coils are heated in a heat chamber. The oven bonding method can be used for fusing narrow wires that cannot be electrified due to excessively high resistance or thick wire coils that require a large current. The oven bonding method can be used to make microwave ovens.

In the resistance heating method, electric current is used to melt and fuse bonding films by generating Joule heat. In this method, the temperature is determined on the radiation effect, which is affected by the conductor diameter, film thickness, wire turns, coil shape, and surrounding environment. The resistance heating method can be used to make microwave ovens.

At Step 307, predetermined portions 308C and 308D of an insulation layer 308A of the wires 308 are cut using a laser device 330 or any cutting tools, such as any mechanical cutting devices (e.g., scissors, strippers, nips, knifes among others). The predetermined portions 308C and 308D of insulation layer 308A are stripped and the portions 308B and 308E of a conducting wire are exposed, which are welded to a pad of the computer chip 304. A person of ordinary skill in the art appreciates that the predetermined portions 308C and 308D can be any length (e.g., 0.2-1.5 cm or the tip of the magnet wires), so long as it is sufficient to be welded/connected with targeting connecting components (such as the pad of the computer chips).

At Step 309, a protective layer 310 is applied to cover/encapsulate the welding/exposed conducting wire portion. The protective layer 310 can be a polymer, such as PE, PP or polyurethane. The protective layer 310 can also be an insulating material, such as an insulating self-adhesive tape.

Figure 4:
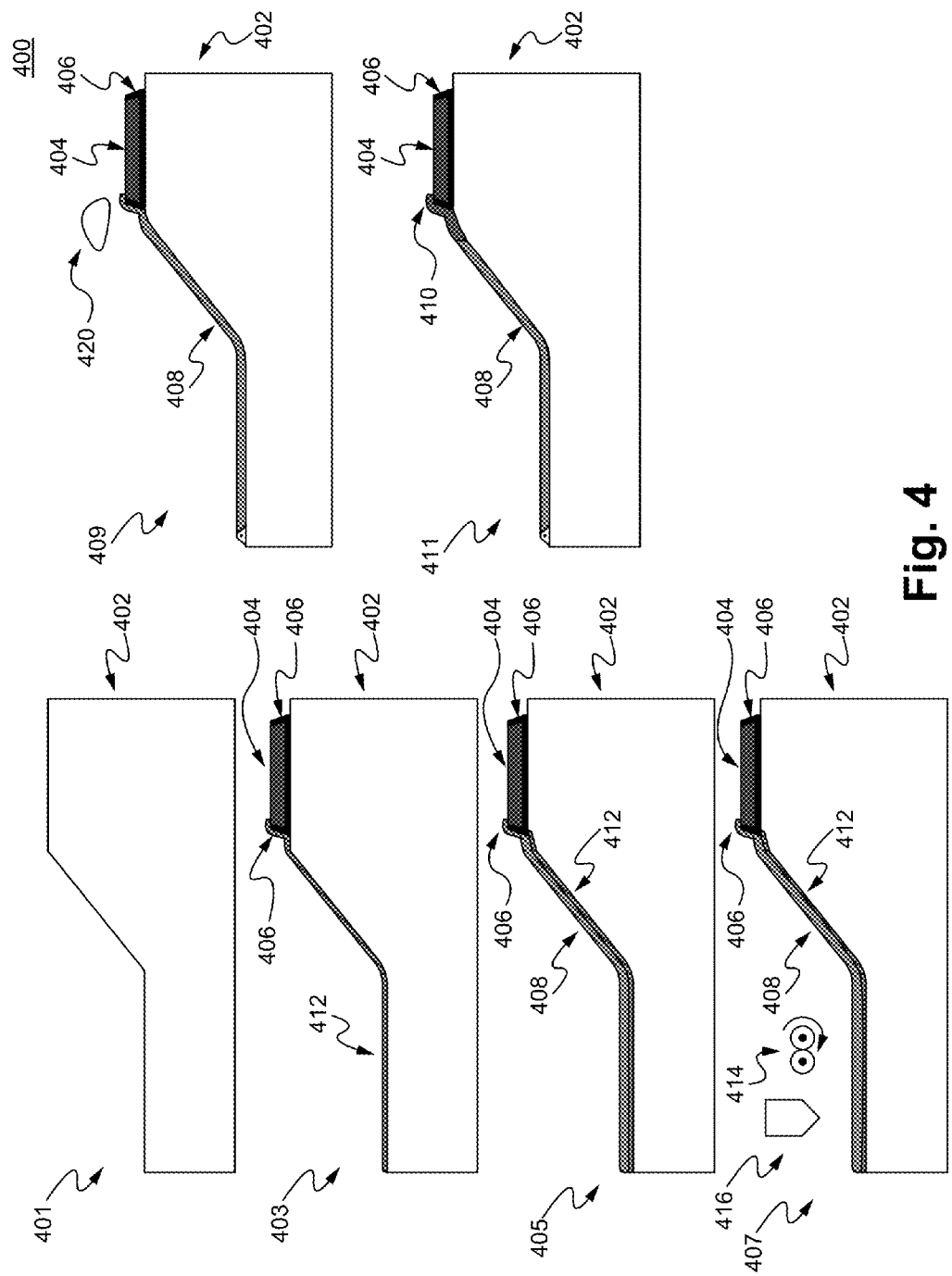
FIG. 4 illustrates another electronic circuitry manufacturing method in accordance with some embodiments of the present invention.

FIG. 4 illustrates another electronic circuitry manufacturing method 400 in accordance with some embodiments of the present invention. At Step 401, a substrate 402 is manufactured. The substrate 402 can be a polymeric three dimensional object.

At Step 403, a computer chip 404 is coupled with the substrate 402. The coupling of the computer chip 404 and the substrate 402 can be achieved by using a die attaching material 406, such as a conducting/non-conducting glue. The coupling immobilizes or secures the computer chip 404 on the substrate 402. Further, an amount of adhesives 412 are applied on the surface of the substrate, such that magnet wires are able to be coupled with/secured on the surface of the substrate 402. A person of ordinary skill in the art appreciates that the amount of adhesive 412 can be sufficient to secure the attaching object from falling off. At Step 405, one or more magnet wires 408 are coupled with the substrate 402 via the attaching force of the adhesive 412.

At Step 407, an external force/pressure is applied on the wires 408, such that the wires 408 are firmly coupled with the substrate 402. The force/pressure can be generated by a mechanical device 414, such as a pressing roller. Next, a laser 416 is used to melt a polymer skin/insulation coating that wraps a conductive wire of the wires 408. The polymer skin/insulation coating solidifies when it cools down below its melting point. The melting and solidification processes form a new protecting layer over the wires 408 on the substrate 402.

At Step 409, solders 420 are used to connect the exposed wires 433 to the chip 404. During the soldering process, the insulation layer of the wires 408 acts as a flux, which avoids a step of stripping the insulation layer while making the electrical connections.

At Step 411, a protective layer 410 is applied to cover/encapsulate the welding/exposed conducting wire portion. The protective layer 410 can be a polymer, such as PE, PP or polyurethane. The protective layer 410 can also be an insulating material, such as an insulating self-adhesive tape.

Figure 5:
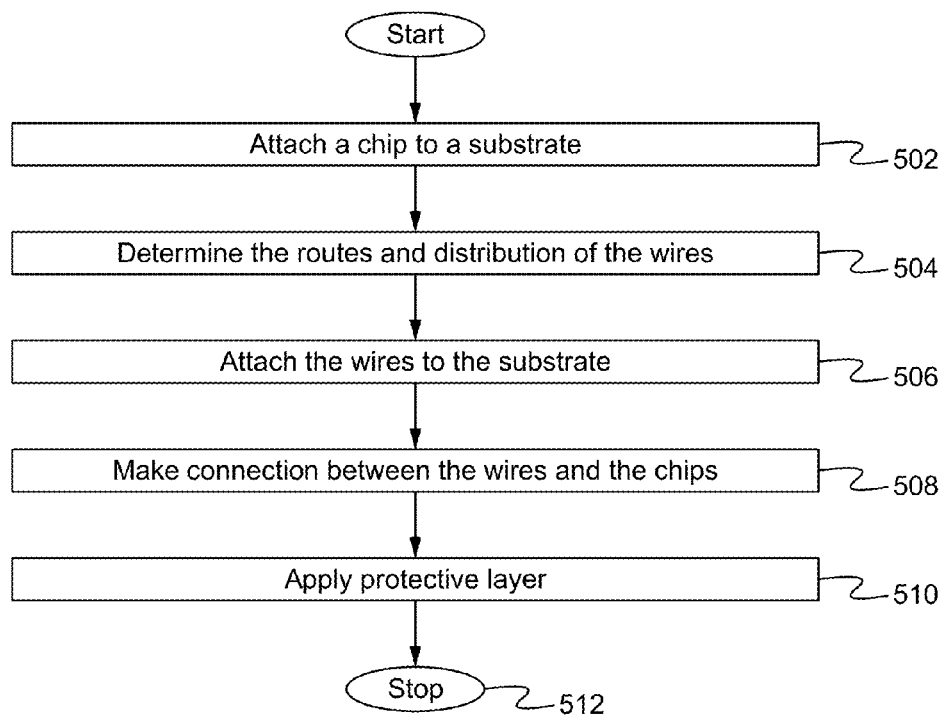
FIG. 5 is a flow chart illustrating a magnet wire applying method in accordance with some embodiments of the present invention.

FIG. 5 is a flow chart illustrating a magnet wire applying method 500 in accordance with some embodiments of the present invention. At step 502, one or more computer chips are attached to a substrate. At Step 504, the routes/paths/distribution of the wires are determined. The determination can be done by referencing to a circuit blue print. At Step 506, the magnet wires are attached to the substrate. At Step 508, connections between the conductive portion of the magnet wires and the computer chip are made. At Step 510, protective layers are applied to prevent the exposure of the conducting portion of the magnet wires. The method 500 can stop at Step 512.

Magnet wires used as conductive wires provide many superior features in the industrial applications and uses. For example, some of the magnet wires are commercially available with various diameters, such as 1 mil or 0.1-2 mils. Some of the magnet wires are coated with insulating materials, such that shorting can be prevented between wires. The magnet wires can be embedded on or in polymer substrate as circuit traces without going through complicated PCB fabrication process. Furthermore, magnet wire has better electrical conductivity when compared with printed circuits on PCB, thereby the magnet wire is able to endure higher current and voltage. Moreover, the magnet wire can be embedded on a surface of a 3D object, which are difficult to be achieved by typical processes.

The methods and devices disclosed here can be utilized in making electronic connections for consumer electronics, such as transformers, inductors, motors, speakers, hard disk head actuators, and other applications that use tight coils of wire. The wires are able to be fully annealed and electrolytically refined copper.

In some embodiments, the magnet wire used herein comprises four layers of insulation. Two of the four layers can comprise different compositions for providing a tough and continuous insulating layers for structure integrity. The chemicals for the polymer layers can be selected with a high (e.g., 250° C.) or low melting temperature. In some embodiments, the insulation layer of the wires can be Telfon, fiberglass yarn with vanish, aramid paper, kraft paper, mica, and polyester. The polymers used can be determined by their breakdown voltage.

The magnet wires or enameled wires used herein can be copper, silver, gold, or aluminum wire coated with a thin layer of insulation. The magnet wires chosen can be in a temperature class of 105° C., 130° C., 155° C., 180° C., and 220° C., which indicates the temperature of wire when it has a 20,000 hour service life.

In operation, the method of applying the magnet wires including holding the wire in place using a tool (like capillary for wire bonding) and pushing the wire against a polymer substrate based on the circuitry design. An amount of adhesive can be pre-applied on the surface of the substrate. While the wire is pushed onto the substrate, an amount of UV or heat is applied locally to cure the adhesive. Accordingly, the wires can be placed, attached, and secured to the substrate when the adhesive is cured or dried.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. A method of forming an electronic circuit comprising:
   a) coupling one or more magnet wires with a substrate along a surface contour of the substrate;
   b) immobilizing the one or more magnet wires on the substrate;
   c) melting an insulating coating of the magnet wires to form a protecting layer over a conducting wire; and
   d) forming the electronic circuit by electrically coupling the one or more magnet wires with an integrated circuit chip.

2. The method of claim 1, wherein the contour comprises a non-flat surface.
3. The method of claim 1, further comprising applying an amount of adhesive on the substrate.
4. The method of claim 1, further comprising applying an amount of adhesive on the one or more magnet wires.
5. The method of claim 1, wherein the one or more magnet wires comprise a self bonding magnet wire.
6. The method of claim 5, further comprising applying an amount of alcohol to the magnet wires.
7. The method of claim 5, further comprising bonding in an oven.
8. The method of claim 5, further comprising bonding by generating an electric current.
9. The method of claim 1, further comprising removing a portion of an insulating layer by using a laser pulse.
10. The method of claim 9, further comprising covering the portion with an insulating material.
11. A method of forming a three dimensional electronic circuit comprising:
    a) shaping a magnet wire according to a surface shape of a substrate;
    b) immobilizing the magnet wire on the surface;
    c) melting an insulating coating of the magnet wires to form a protecting layer over a conducting wire; and
    d) coupling the magnet wire with an electronic component.
12. The method of claim 11, wherein the three dimensional electronic circuit is part of a circuit board.
13. The method of claim 11, wherein the circuit board is coupled with a microwave oven.
14. The method of claim 11, wherein the circuit board is coupled with an electric motor.

* * * * *